(12) United States Patent
Ni et al.

(10) Patent No.: US 7,323,875 B2
(45) Date of Patent: Jan. 29, 2008

(54) SHIMMING STRUCTURE AND METHOD FOR A MAGNETIC RESONANCE IMAGING APPARATUS

(75) Inventors: Cheng Ni, Shenzhen (CN); Ting Qiang Xue, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 101 days.

(21) Appl. No.: 10/557,829

(22) PCT Filed: May 21, 2004

(86) PCT No.: PCT/EP2004/005513

§ 371 (c)(1),
(2), (4) Date: Nov. 22, 2005

(87) PCT Pub. No.: WO2004/104615

PCT Pub. Date: Dec. 2, 2004

(65) Prior Publication Data

US 2007/0069731 A1    Mar. 29, 2007

(30) Foreign Application Priority Data

May 23, 2003   (CN) ............................. 03 1 36672

(51) Int. Cl.
*G01V 3/00* (2006.01)
(52) U.S. Cl. .................................................. 324/320
(58) Field of Classification Search ........ 324/300–322; 600/410–435; 335/296–306; 29/592–593, 29/599, 602.1, 607
See application file for complete search history.

(56) References Cited

U.S. PATENT DOCUMENTS

| | | | | |
|---|---|---|---|---|
| 4,672,346 A | | 6/1987 | Miyamoto et al. | |
| 4,766,378 A | * | 8/1988 | Danby et al. | 324/307 |
| 5,061,897 A | * | 10/1991 | Danby et al. | 324/318 |
| 5,124,651 A | * | 6/1992 | Danby et al. | 324/318 |
| 5,134,374 A | | 7/1992 | Breneman et al. | |
| 5,386,191 A | * | 1/1995 | McCarten et al. | 324/318 |
| 5,490,509 A | * | 2/1996 | Carlson et al. | 600/410 |

(Continued)

FOREIGN PATENT DOCUMENTS

EP    0 619 499    10/1994

(Continued)

OTHER PUBLICATIONS

Patent Abstracts of Japan Publication No. 03297445, for Japanese Application No. 02101459.

*Primary Examiner*—Brij Shrivastav
*Assistant Examiner*—Dixomara Vargas
(74) *Attorney, Agent, or Firm*—Schiff Hardin LLP

(57) ABSTRACT

In a magnetic resonance imaging apparatus and a method for shimming such an apparatus, at each of mirror-symmetrical assemblies respectively disposed at opposite faces of a static magnetic field generator, that each include a shimming ring, an additional shimming ring is provided that is adjustable in position relative to the other shimming ring to shim the static magnetic field. Additionally or alternatively, at each face of the static magnetic field generator, a permanently magnetic arrangement is provided that is divided into a number of permanently magnetic columns respectively having different energy levels. Additionally or alternatively, magnetic bolts, such as magnetically conducting bolts or permanently magnetic bolts can be symmetrically inserted into either of the mirror-symmetric assemblies, or the permanently magnetic columns, for additionally shimming adjustment.

18 Claims, 4 Drawing Sheets

U.S. PATENT DOCUMENTS

| | | | |
|---|---|---|---|
| 5,555,251 A * | 9/1996 | Kinanen | 324/319 |
| 5,627,471 A * | 5/1997 | Kinanen | 324/319 |
| 6,163,154 A * | 12/2000 | Anderson et al. | 324/320 |
| 6,218,838 B1 * | 4/2001 | McGinley et al. | 324/320 |
| 6,333,630 B1 * | 12/2001 | Holsinger et al. | 324/319 |
| 6,335,670 B1 * | 1/2002 | Kinanen | 335/296 |
| 6,856,223 B1 * | 2/2005 | Takeshima et al. | 335/301 |
| 2002/0021129 A1 | 2/2002 | Laskaris et al. | |
| 2002/0056185 A1 | 5/2002 | Benz et al. | |
| 2006/0267715 A1 * | 11/2006 | Ni et al. | 335/297 |

FOREIGN PATENT DOCUMENTS

| | | |
|---|---|---|
| EP | 0 921 408 | 6/1999 |
| EP | 0 927 889 | 7/1999 |
| EP | 1 154 280 | 11/2001 |
| GB | 2 319 339 | 5/1998 |

* cited by examiner

SHIMMING STRUCTURE AND METHOD FOR A MAGNETIC RESONANCE IMAGING APPARATUS

BACKGROUND OF THE INVENTION

1. Field of the Invention

The present invention relates to a method for adjusting the static magnetic field in a magnetic resonance imaging (MRI) device and a static magnetic field generating apparatus that generates a higher field strength. The present invention can be used In a C-type magnet of a magnetic resonance imaging apparatus, but is also suitable for use in other devices using an electra-magnet to generate a uniform static magnetic field, without limitation to the exemplified C-type.

2. Description of the Prior Art

In the early development of magnetic resonance imaging equipment for commercial use, the field strength of the permanent magnet was usually lower than 0.25 T. In the 1990's, magnetic resonance imaging equipment for commercial use were developed that employed a permanent magnet with a field strength of 0.3 T and the performance thereof was better, the cost was reasonable and the structure was compact. The greater the field strength, the higher the signal-to-noise ratio, and the better the quality of the image generated by the permanent magnet magnetic resonance equipment. In recent years, the field strength of some of the permanent magnets can reach 0.35 T-0.4 T.

At present, certain problems exist In the manufacturing of a magnet with a higher field strength:

I. Permanent magnets having a field strength greater than 0.3 T and with high homogeneous magnetic field in the scanning area are expensive, large in volume and heavy in weight (heavier than 17 tons) and need a large area for installation, and thus have limited application in magnetic resonance equipment.

II. Since a uniform strong magnetic field is to be generated, the size of the pole plates usually is large, thus the open angle between the two pole plates will inevitably be limited and this is a problem for patients subject to claustrophobia.

III. The magnet needs shimming or repairing during its installation and use, or re-shimming is required when service and thus the gradient coil and transmitting coil have to be removed, which is time-consuming and expensive.

IV. Due to manufacturing tolerances, magnets of the same design may have different field strengths, thus volume production of the same RF coils and the systems becomes very difficult and the costs for the corresponding system of the whole magnetic resonance equipment increase.

To address the above problems, the following methods are conventionally employed:

I. To increase the field strength and improve the field homogeneity, but this increases the volume and size of both the permanent magnet and the pole plate, which will increase the cost as well as the volume and weight of the magnet.

II. The homogeneity of the magnetic field is improved by employing a Rose ring but when the field strength is over 0.3 T, the magnetic field homogeneity of the permanent obtaining a magnetic resonance image of the whole human body becomes worse and a single Rose ring cannot ensure the homogeneity of the field.

III. Permanent magnets that reduce magnetic flux leakage are employed to compensate for the field strength leakage in the external edge of the pole plate, but this increases the size of the external edge of the magnet pole plate and reduces the open angle between the pole plates and furthermore requires complicated manufacturing process and hence increases the cost.

IV. Field strength adjusting and fine adjusting structures are employed, but these mechanisms are complex in design and expensive.

Moreover, the effects achieved by all of these known methods are still not satisfactory.

SUMMARY OF THE INVENTION

The method and apparatus of the present invention employ the following features to overcome the aforementioned disadvantages in the prior art.

V. Employing another adjusting shimming ring (the second type of Rose ring) without increasing the size of the pole plate to improve the uniformity of the magnetic field while not reducing the open angle between the pole plates. The additional shimming ring (the second type of Rose ring) has a variable distance with respect to the first type of Rose ring so as to change the magnetic path and adjust the uniformity of the magnetic field.

VI. Distribute permanent magnetic materials having different magnetic energy levels in special manners so as to improve the homogeneity of the magnetic field and reduce the cost.

VII. Three methods are employed in the present invention to adjust the magnetic field strength and shimming. One is adjusting and shimming the static magnetic field by fine adjusting magnetic conducting bars or permanent magnetic bars installed on the external edge of the pole plate for example of the C-type magnet, so as to compensate for the inhomogeneous magnetic field caused by tolerances of magnet manufacturing and assembling; another is providing a magnetic conducting or permanent magnet bolt adjusting mechanism on the shimming Rose ring, and the magnetic path is changed by adjusting the position of the bolt so as to adjust the magnetic field; the other method is changing the magnetic path by changing the position of the second type of shimming ring with respect to the first type of Rose ring as mentioned in method, and thereby adjusting the magnetic field. The combined application of these three methods will achieve a large range of adjustment and is easy in operation. Hence, the inhomogeneity caused by the tolerances of manufacturing and assembling is compensated and the field strength of the permanent magnet is made uniform.

Further, the method and apparatus of the present invention use the above-mentioned two or three methods jointly to achieve better shimming effect.

In the prior art, the Rose shimming ring is provided at the external edges on the horizontal plane of the pole plates of both the upper and lower poles, but the shimming effect achieved by a single pair of shimming rings is not satisfactory. Due to the characteristics of the structure of the permanent magnet, the magnetic field strength at the edge of the pole plate is relatively weak, which is especially serious when the field strength is over 0.3 T, thus single shimming ring cannot fully compensate the inhomogeneity of the magnetic field. The present invention improves the design and fixing manner of the gradient coil and the transmitting coil. Taking the upper pole plate shimming ring as an example, an additional shimming ring (the second type of Rose ring) with adjustable distance to the shimming ring is employed at the external edge of the lower end of the first shimming ring to change the homogeneity of the magnetic field and a corresponding shimming adjusting mechanism is provided. Similarly, the second type of shimming ring the spacing of which from the first shimming Rose ring is adjustable, is also employed at the corresponding position on the lower pole plate.

To address the aforementioned disadvantages in the prior art, the present invention provides a static magnetic field generating apparatus in the magnetic resonance equipment having a permanent magnet magnetic field source and a C-type yoke or a multipart supporting structure that forms the magnetic path. The is positioned in the space between the two opposite end faces of the permanent magnet magnetic field source. The two opposite end faces are mirror symmetrical with respect to the virtual plane between the two faces. Pole plates are placed on each of the opposite end faces. The structure is symmetrical with respect to the virtual middle plane but, in the upper half for example, pole pieces are disposed beneath the aforementioned pole plate, a gradient coil is disposed beneath the pole piece, an RF transmitting coil is disposed beneath gradient coil, a first shimming ring is employed outside the gradient coil. Each pair of pole plates, pole pieces, gradient coils, RF transmitting coils and the first shimming rings are substantially mirror symmetrical with respect to the virtual plane between the two opposite end faces. An additional second shimming ring is employed on the external edge of the each of the first shimming rings, and the second shimming ring is symmetrical to the aforementioned virtual plane, to homogenize the static magnetic field in the space, occupied by the examination subject.

According to the static magnetic field generating apparatus of the present invention, the outer faces of the additional upper and lower shimming rings that force the examination subject do not project beyond the outer plane of the RF transmitting coils so as to maintain the openness of the magnet.

Another solution for the static magnetic field generating apparatus of the present invention is to form the magnetic field source with multiple groups of permanent magnetic columns of different magnetic energy levels. This distribution of magnetic energy levels in the columns can be axially symmetric with respect to the central axis through the pole center but perpendicular to the pole plane. The distribution of energy levels in the columns can also be symmetric with respect to one or more axis in the pole plane through the center point of the pole, for example, the left and right halves, and the front and back halves are symmetrical.

In an embodiment of the static magnetic field generating apparatus of the present invention, the permanent magnet magnetic field source is arranged in rings according to the magnetic energy levels. The number of rings can be two, three or more. For example, when three rings are arranged, the permanent magnet magnetic field source is divided into three ring areas according to the magnetic energy levels, wherein the magnetic energy level of the external ring area is N3, the magnetic energy level of the middle ring area is N2, and the magnetic energy level of the inner ring area is N1, and N3>N>N1.

In another embodiment of the static magnetic field generating apparatus of the present invention a number of magnetically conducting bolts or permanently magnetic bolts are arranged symmetrically with respect to axes in the pole plane. Those adjusting bolts are mounted on one or more of the parts of the pole plate, the magnetic field source, the first shimming ring or the second shimming ring, so that the field strength of the static magnetic field is precisely adjusted.

In the prior art, the field strength at the edge of the magnet is usually lower than that at the center. Therefore, as a measure in the prior art, adding a first shimming ring to the outer side of the gradient coil will increase the field strength at the edge, but the present invention is based on the finding that using only a first shimming ring will not achieve satisfactory effect. Thus, in accordance with the present invention, a second adjustable shimming ring is added to the side of the first shimming ring that faces the examination subject and to the outer side of the gradient coil, and the relation between the gradient coil and the transmitting coil is adjusted. For volume production of the system, the manufacturing tolerances need to be considered.

According to the above-mentioned principle of the present invention, a shimming ring of different shape could be designed to replace the first shimming ring and the second shimming ring.

In another embodiment, for shimming to achieve higher homogeneity, the magnetic field profile has to be re-designed when designing the magnetic source assemblies of different magnetic energy levels. In this process, the factors that influence the field strength of the magnetic field should be considered, for example, manufacturing precision, deviation of the assembling position and even minor corner damage of the magnetic columns in the assembling process.

As a part of the present invention, for the adjusting bolts of ferromagnetic or permanent magnetic material, screw threads are provided on many parts of the magnetic field generating apparatus, and the bolts are made of magnetic materials that are the same as or different from the materials of the parts. Matching between the screw threads and the bolts is very important, because if they are too tight, a strong force has to be applied to the screw during adjustment thus causing deformation or even breakage of the bolts, but if they are too loose, the vibration caused by the pulsed magnetic force will cause the field strength to become unstable thus causing irregular changes of field strength.

Dependent on the manufacturing conditions, the additional shimming ring, the permanent magnetic field source of different magnetic energy levels, and the adjusting bolts of magnetic material of the present invention could be used jointly. For instance, the shimming effect could be achieved by using a second shimming ring in combination with permanently magnetic columns of different magnetic energy levels, or by using the second shimming ring in combination with fine adjustment by magnetic conducting bolts or permanent magnetic bolts. The shimming effect could also be achieved by adopting permanent magnetic columns of different magnetic energy levels to form the magnetic field profile while combining the method of fine adjustment by magnetic bolts.

Alternatively, the shimming effect can be achieved by using the second shimming ring, the magnetic source composed of permanent magnetic columns of different magnetic energy levels and the fine adjustment by magnetically conducting bolts or permanently magnetic bolts at the same time.

The present invention also includes a method for adjusting the static magnetic field in magnetic resonance equipment, said magnetic resonance equipment having a permanent magnet magnetic field source, a C-type yoke or a multi-post supporting structure that forms the magnetic path, with the examination subject being positioned in the space between the two opposite end faces of the permanently magnetic columns. The two opposite end faces are mirror symmetrical with respect to the virtual plane between the two faces. Pole plates are placed along the direction of the measured body on each of the opposite end faces. The structure is symmetrical with respect to the virtual middle plane. In the upper half for example, pole pieces are disposed beneath the aforementioned pole plate, a gradient coil is disposed beneath the pole piece an RF transmitting coil is disposed beneath the gradient coil, a first shimming ring is disposed outside the gradient coil. Each pair of pole plates, pole pieces, gradient coils, RF transmitting coils and first shimming rings are substantially mirror symmetrical with respect to the virtual plane between the two opposite end faces. An additional second shimming ring is disposed on the external edge of the each of the first shimming rings. The second shimming ring is symmetrical to the above virtual plane, to homogenize the static magnetic field in the space of the measured body, the permanent magnet magnetic field source is composed of a groups of permanent magnetic columns of different magnetic energy levels, so that the magnetic energy level of the permanent magnetic columns farther from the center of the pole plate is higher than that of the permanent magnetic columns nearer to the center of the pole plate, and to improve the homogeneity of the magnetic field. Further on the basis of the above-mentioned method, a number of magnetic conducing bolts or permanent magnetic bolts are employed symmetrically along the end face axis of the permanently magnetic column on the pole plate, or along the permanently magnetic column, the first shimming ring and the second shimming ring. By adjusting the positions of the magnetically conductive bolts or permanently magnetic bolts, the field strength of the static magnetic field is adjusted.

Another embodiment of the inventive method of adjusting the static magnetic field in MR equipment is applicable to magnetic resonance equipment having a permanent magnetic source, and a C-type yoke or a multipost supporting structure that forms the magnetic path. The examination subject is positioned in the space between the two opposite end faces of the permanent magnetic source, the two opposite end faces being mirror symmetrical with respect to the virtual plane between the two faces. Pole plates are disposed on each of the opposite end faces. The structure is symmetrical with respect to the virtual middle plane. In the upper half for example, pole pieces are disposed beneath the aforementioned pole plate, a gradient coil is disposed beneath the pole piece, an RF transmitting coil is disposed beneath the gradient coil, a shimming ring is disposed outside the gradient coil. Each pair of the pole plates, pole pieces, gradient coils, RF transmitting coils and shimming rings are substantially mirror symmetrical with respect to the virtual plane between the two opposite end faces. The permanent magnetic source is composed of a multiple groups of permanent magnetic columns of different magnetic energy levels, so that the magnetic energy level of the permanent magnetic columns farther from the center of the pole plate is higher than that of the permanent magnetic columns close to the center of the pole plate, thereby improving the uniformity of the magnetic field. A number of magnetically conducting bolts or permanently magnetic bolts are employed symmetrically along the end face axis of the permanent magnetic source on one or more of the parts in the aforementioned mirror symmetrical arrangement.

DESCRIPTION OF THE PREFERRED EMBODIMENTS

Figure 1:
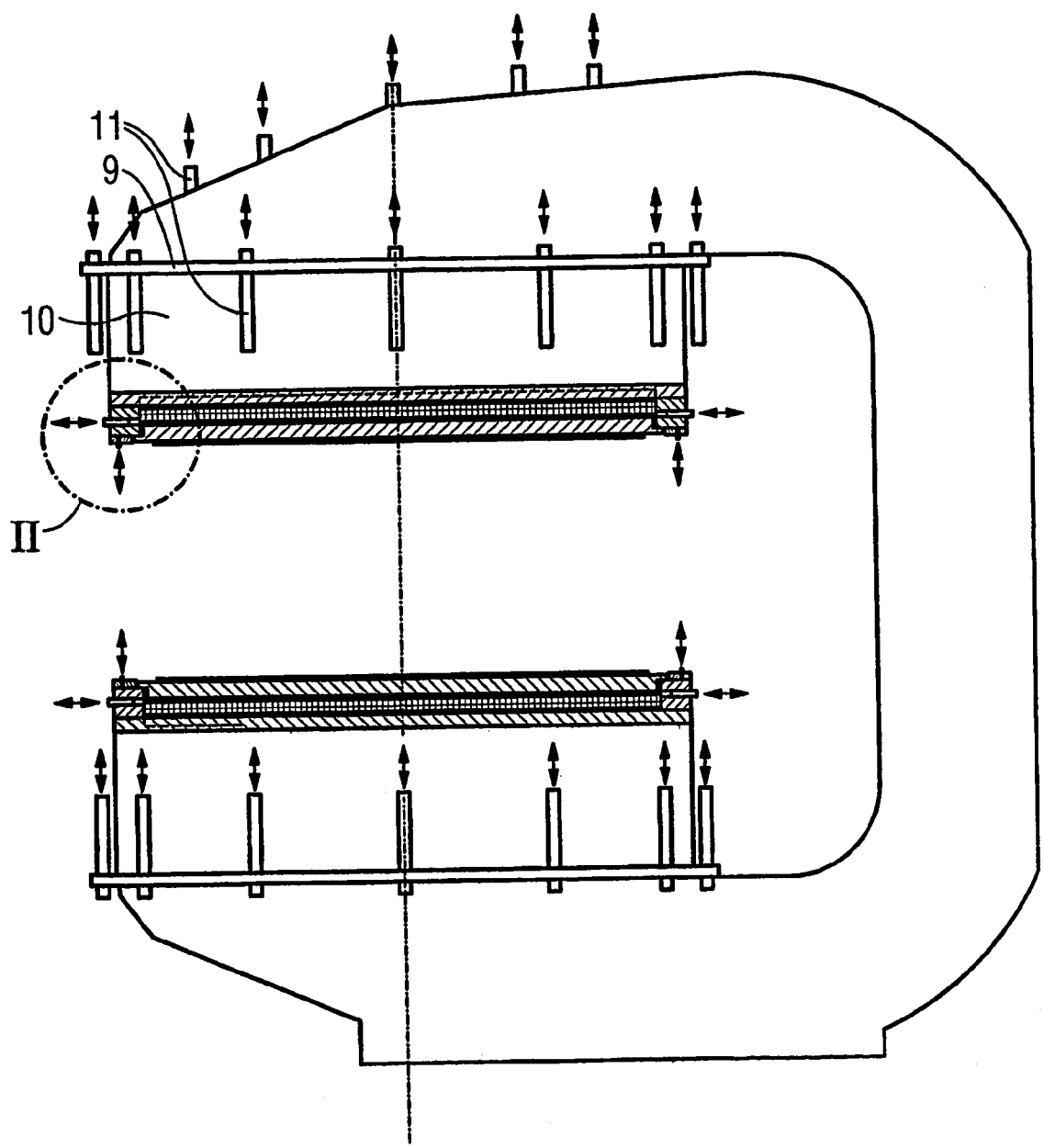
FIG. 1 is a side view of a magnetic resonance imaging apparatus having a C-type magnet, constructed and shimmed in accordance with the principles of the present invention.

FIG. 1 shows shimming rings of the upper and lower poles of a C-type magnet. The apparatus has a press plate and a magnetic field generating source 10, having permanently magnetic columns (see FIG. 4). A number of magnetically conducting or permanently magnetic bolts 11 are movable up and down at external edge of the magnetic field source in FIG. 1 so as to achieve the above-mentioned adjustable effect.

Figure 2:
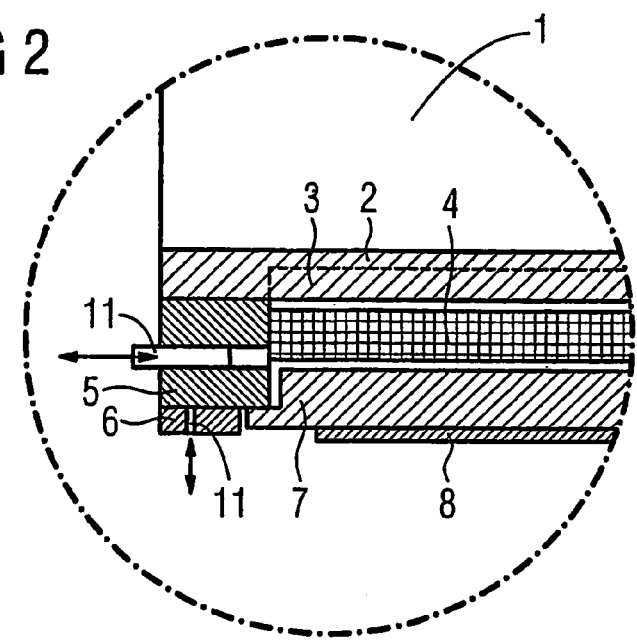
FIG. 2 is an enlargement of the circled portion of FIG. 1.

FIG. 2 is an enlargement of the portion marked in a circle in FIG. 1, showing the permanent magnetic source 1, the pole plate 2, the pole plate 3 after cutting processing, another pole plate 4, the first shimming ring 5, the second shimming ring 6 with an adjusting means, the gradient coil 7 and the RF emitting coil 8. In accordance with the invention shimming ring 6 has been added in addition to the original shimming ring 5. In FIG. 2, the outer diameter of the upper shimming ring 5 is the same as that of the lower shimming ring 6. The inner diameter of shimming ring 6 is larger than that of the shimming ring 5, so the space that is smaller than the inner diameter of shimming ring 6 and that is under the shimming ring 5 can be used for fixing the gradient coil 7. The lower end face of the shimming ring 6 does not extend or project below the lower plane of the transmitting coil 8. Similarly, the two shimming rings of the lower pole plate 4 are located at the position that corresponds to the position in the upper plate 2, so the respective distances between the upper and lower pole plates 2 and 4, as well as between the two shimming rings 5 and 6, are not reduced, i.e., the openness will not be affected. In FIG. 2, arrows that show movement horizontally and vertically respectively are used to indicate that the shimming ring 6 and the bolts mounted on the first shimming ring 5 can be adjusted in these two directions.

Careful consideration as to the size and position of the second shimming ring 6 will help to improve the magnetic field distribution at the edge and enhance the adjusting effect of the shimming, but the open space between the upper and lower poles will not be affected.

Figure 4:
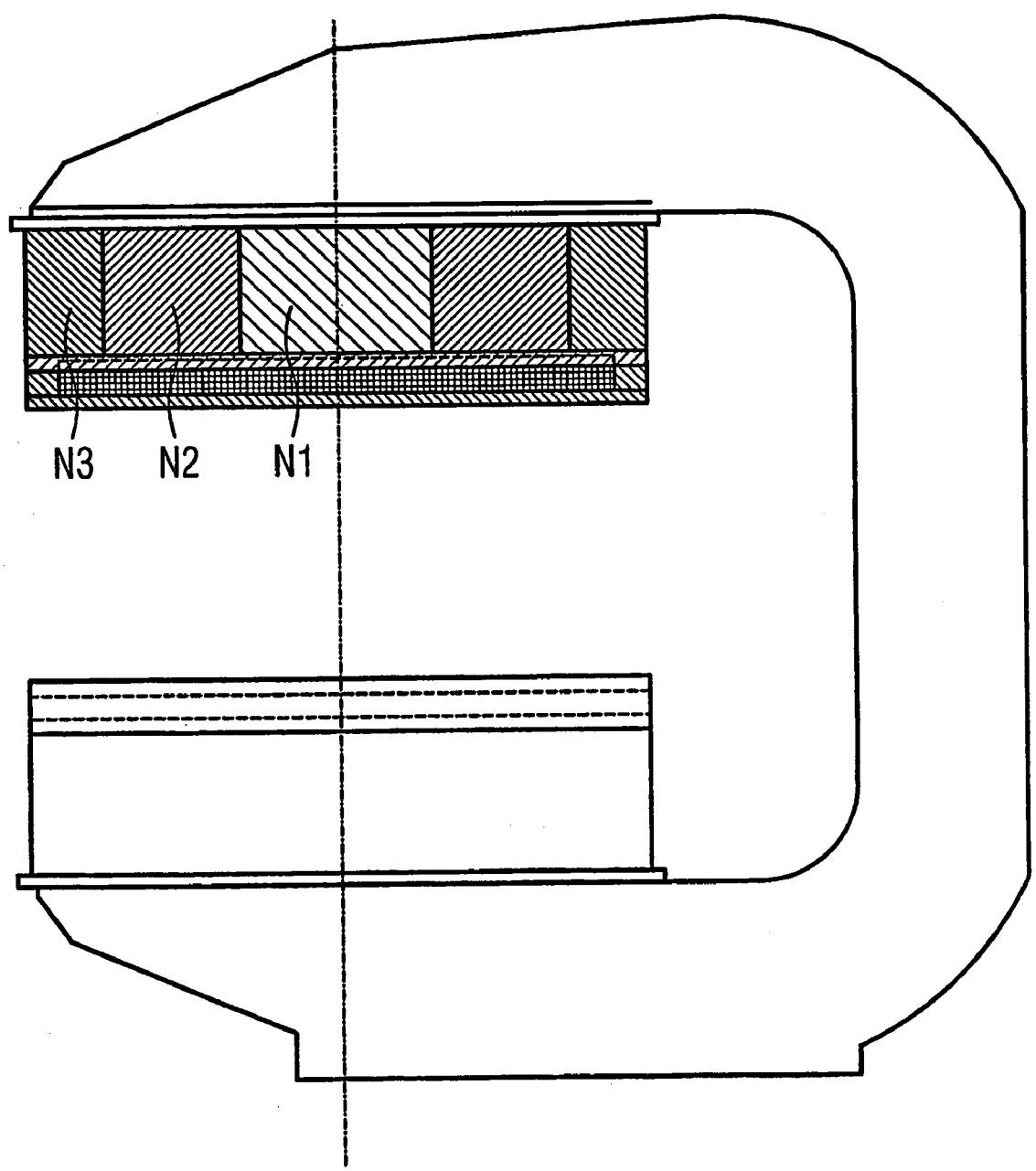
FIG. 4 is a side view, partly in section, of a further embodiment of a static magnetic field generator of a magnetic resonance imaging apparatus in accordance with the present invention, wherein the magnet is divided into columns respectively having different magnetic energy levels.

FIG. 4 shows another method of adjusting the homogeneity of the field strength. Generally, for a permanent magnet with a field strength above 0.3 T, the field strength at the edge of the pole plate thereof is weaker than at the center of the pole plate. In order to make the magnetic field of the area between the two pole plates more uniform, the inventive method divides the magnetic field generating source into several areas, and magnets at different areas have different magnetic energy levels. As an example shown in FIG. 4, the several circular-shaped or ring-shaped columns on the pole plate of the present invention that are centered at the axis of the pole plate have different magnetic energy levels, wherein the magnetic energy level in the center column is N1, the magnetic energy in the middle column is N2 and the magnetic energy level in the external column is N3 and N1<N2<N3. Also, as shown in FIG. 4, a number of magnets of different magnetic energy levels can be provided in a symmetrical manner along the vertical axis through the center of the pole plate.

Figure 5:
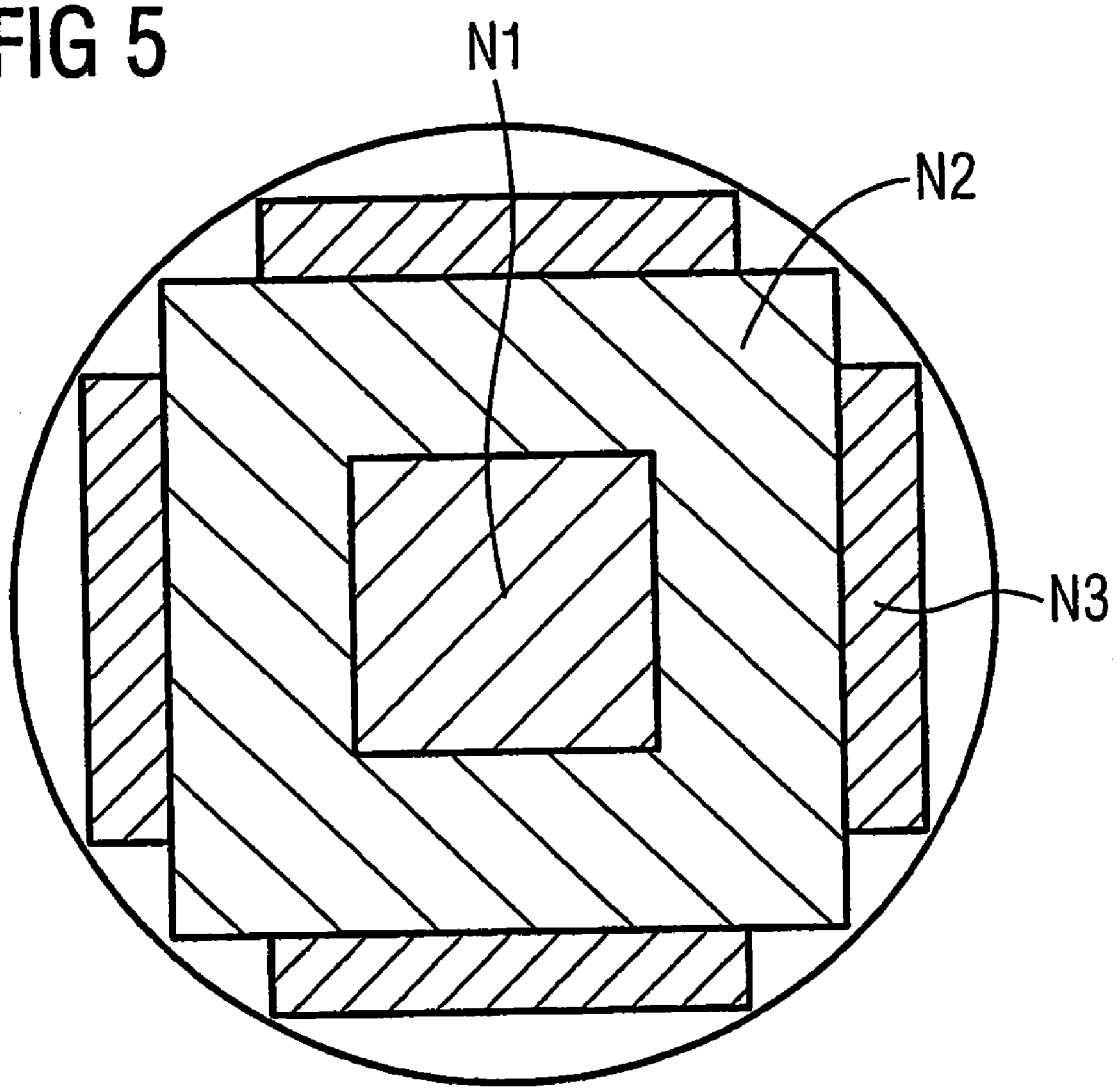
FIG. 5 is a sectional view of the apparatus of FIG. 4, in and plane proceeding perpendicularly to the vertical dot-dash axis shown in FIG. 4.

FIG. 5 is a longitudinal section of the magnet, and the shadows of different gray levels indicate magnet objects of different magnetic energy levels, which are symmetrical along the center of the magnet. The magnetic energy level at the center area is lowest and magnets nearer the external edge have higher magnetic energy levels. Other magnetic energy levels combination forms can be derived on the basis of the principle of the present invention according to the non-uniform structure intentionally designed on the pole plate and the characteristics of the magnetic path. Each magnetic energy level could be further divided into a number of sub-levels, and the ordering of the energy levels is not limited to increasing from the center to the outer edge, and adjustment could be made on the basis of the pole plates and the magnetic path structures of the devices.

Figure 3:
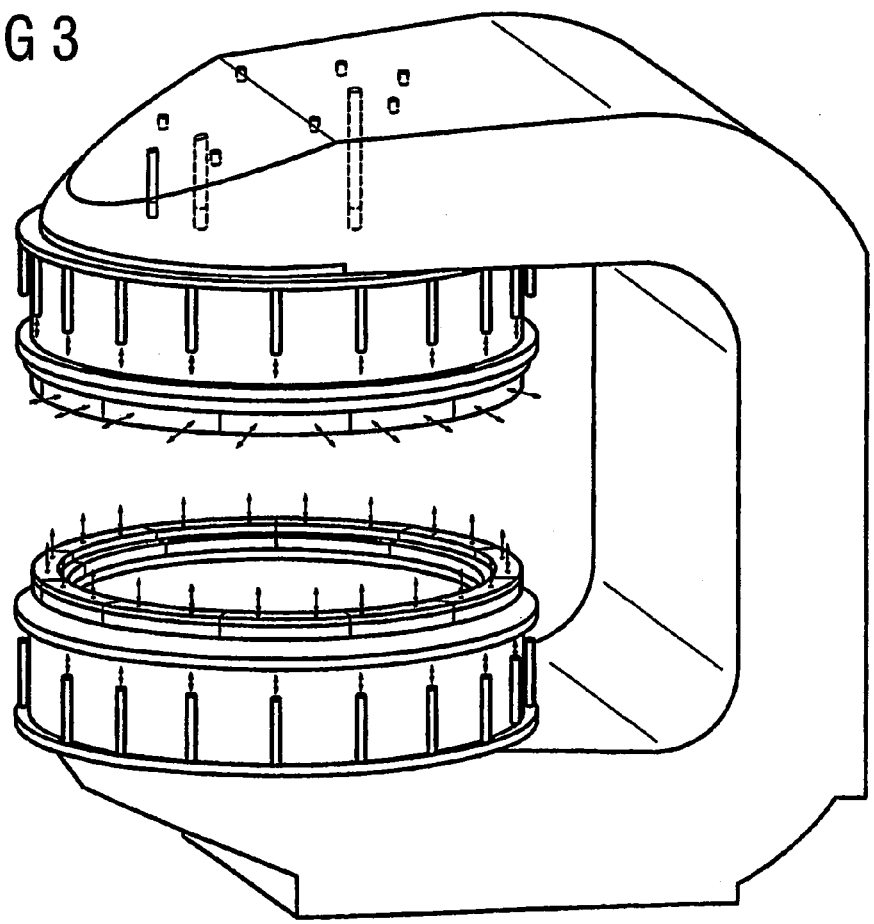
FIG. 3 illustrates an embodiment of a method for adjusting (shimming) the magnetic field strength in accordance with the invention, using a number of magnetically conducting or permanently magnetic bolts.

As shown in FIG. 3, another method of uniforming the magnetic energy level of the present invention is to insert a plurality of magnetic bolts at the external edges of the pole plate and the press plate, and the homogeneity of the field strength is adjusted by changing the magnetic path. As shown in FIG. 3 (and FIG. 1), these magnetic bolts could be arranged symmetrically. However, if the influence of the middle section connecting object of the C-type magnet on the field strength between the two poles or other multi-column plate structures are considered, these bolts could also be arranged in a non-symmetrical way. In the existence of tolerances of manufacturing and assembling of said magnetic resonance imaging equipment, the field strength of the diagnosing area could be adjusted by adjusting these bolts to some extent. The material of the bolts can be permanently magnetic material or ferromagnetic material and the diameters of the bolts could be either the same or different, but they are preferably the same. The bolts should be arranged symmetrically or near symmetrically, and the number of the bolts should be set according to the strength of the magnetic field and the practical structure, and too many bolts will make the adjusting difficult. It is not difficult for those ordinarily skilled in the art to change and adjust those bolts according to the specific cases to achieve the shimming effect.

The operators could use one or a combination of the above-mentioned methods to achieve better shimming effect.

An advantage of the apparatus and method of the present invention is that the magnet made by the method of the present invention could have field strength higher than 0.3 T with higher homogeneity in the scanning area satisfying the requirements. Therefore, the size of the apparatus could be reduced and the cost will be reduced. For example, the specifications of the magnet of 0.35 T manufactured according to the present invention are as follows: the weight is less than 16 tons, the uniformity of the magnetic field in 36 cm sphere is less than 40 ppm; and the width of the patient gap is larger than 41 cm and the stability of the static magnetic field is <±20 Hz/10 minutes.

Although modifications and changes may be suggested by those skilled in the art, it is the invention of the inventors to embody within the patent warranted heron all changes and modifications as reasonably and properly come within the scope of their contribution to the art.

We claim as our invention:

1. A magnetic resonance imaging apparatus comprising: a static magnetic field source having two opposite faces connected by a magnetic return structure, said opposite faces facing each other and being separated by a space configured to receive an examination subject therein; first and second assemblies respectively mounted at said opposite faces, said first and second assemblies each being comprised of a plurality of components with the components in said first assembly being disposed mirror-symmetrically, relative to a plane proceeding through said space, with respect to the components in the second assembly;

said components in each of said first and second assemblies comprising, in a sequence from one of said opposite faces toward said plane, a pole plate, a pole piece, gradient coils having an annular exterior, an RF transmission coil, a passive first shimming ring disposed at the annular exterior of said gradient coils, and a passive second shimming ring disposed at said annular exterior of said gradient coils adjacent to said first shimming ring; and said second shimming ring in each of said first and second assemblies being mounted to allow adjustment of a distance of said second shimming ring from the first shimming ring in that assembly.

2. A magnetic resonance imaging apparatus as claimed in claim 1 wherein, in each of said first and second assemblies, said RF transmitting coil has a face facing said plane, and said second shimming ring has a face facing said plane, with said face of said second shimming ring being no closer to said plane than said face of said RF transmitting coil.

3. A magnetic resonance imaging apparatus as claimed in claim 1 wherein said space has a center point and wherein said static magnetic field source, at each of said opposite faces, comprises a plurality of groups of permanently magnetic columns respectively having different magnetic energy levels, said columns being disposed substantially symmetrically relative to an axis proceeding through said center point and a centered one of said plurality of magnetic columns in each of said first and second assemblies, with the respective magnetic energy levels of said centered ones of said plurality of magnetic columns respectively in said first and second assemblies being equal.

4. A magnetic resonance imaging apparatus as claimed in claim 3 wherein, in each of said first and second assemblies, the respective, different magnetic energy levels are axially symmetric with respect to said axis, and wherein said plurality of permanently magnetic columns in each of said first and second assemblies includes a magnetic column formed as an annular ring centered relative to said axis, with the respective magnetic energy levels of said magnetic column formed as an annular ring in the respective first and second assemblies are equal.

5. A magnetic resonance imaging apparatus as claimed in claim 4 wherein, in each of said first and second assemblies, magnetic columns in said plurality of magnetic columns that are disposed farther from said axis have a higher magnetic energy level than magnetic columns in said plurality of columns disposed closer to said axis.

6. A magnetic resonance imaging apparatus as claimed in claim 3 wherein, in each of said first and second assemblies, said plurality of permanently magnetic columns is three, each of said permanently magnetic columns being annular and producing an external annular area having a magnetic energy level N3, a middle annular area having a magnetic energy level N2, and an inner annular area having a magnetic energy level N1, with N3>N2>N1.

7. A magnetic resonance imaging apparatus as claimed in claim 3 comprising, in each of said first and second assemblies, a plurality of magnetic bolts, selected from the group consisting of magnetically conductive bolts and permanently magnetic bolts, respectively disposed substantially parallel to, and symmetrically with respect to, said axis in at least one of said pole plate, one or more of said permanently magnetic columns, said first shimming ring or said second shimming ring, to shim the static magnetic field generated by said static magnetic field source.

8. A magnetic resonance imaging apparatus as claimed in claim 1 comprising, in each of said first and second assemblies, a plurality of magnetic bolts, selected from the group consisting of magnetically conductive bolts and permanently magnetic bolts, disposed symmetrically at an exterior edge of at least one of said static magnetic field source, said pole plate, said first shimming ring, or said second shimming ring, to shim the static magnetic field generated by said static magnetic field source.

9. A magnetic resonance imaging apparatus comprising:
a static magnetic field source having two opposite faces connected by a magnetic return structure, said opposite faces facing each other and being separated by a space configured to receive an examination subject therein, said space having a center point;
first and second assemblies respectively mounted at said opposite faces, said first and second assemblies each being comprised of a plurality of components with the components in said first assembly being disposed mirror-symmetrically, relative to a plane proceeding through said space, with respect to the components in the second assembly; and said space has a center point, said static magnetic field source, at each of said opposite faces, comprises a plurality of groups of permanently magnetic columns respectively having different magnetic energy levels, said columns being disposed substantially symmetrically relative to an axis proceeding through said center point and a centered one of said plurality of magnetic columns in each of said first and second assemblies, with the respective magnetic energy levels of said centered ones of said plurality of magnetic columns respectively in said first and second assemblies being equal.

10. A magnetic resonance imaging apparatus as claimed in claim 9 wherein, in each of said first and second assemblies, the respective, different magnetic energy levels are axially symmetric with respect to said axis, and wherein said plurality of permanently magnetic columns in each of said first and second assemblies includes a magnetic column formed as an annular ring centered relative to said axis, with the respective magnetic energy levels of said magnetic column formed as an annular ring in the respective first and second assemblies are equal.

11. A magnetic resonance imaging apparatus as claimed in claim 10 wherein, in each of said first and second assemblies, magnetic columns in said plurality of magnetic columns that are disposed farther from said axis have a higher magnetic energy level than magnetic columns in said plurality of columns disposed closer to said axis.

12. A magnetic resonance imaging apparatus as claimed in claim 10 wherein, in each of said first and second assemblies, said plurality of permanently magnetic columns is three, each of said permanently magnetic columns being annular and producing an external annular area having a magnetic energy level N3, a middle annular area having a magnetic energy level N2, and an inner annular area having a magnetic energy level N1, with N3>N2>N1.

13. A magnetic resonance imaging apparatus as claimed in claim 9 comprising, in each of said plurality of permanently magnetic columns at the respective opposite faces of said static magnetic field source, a plurality of magnetic bolts, selected from the group consisting of magnetically conducting bolts and permanently magnetic bolts, disposed symmetrically relative to said axis and proceeding substantially parallel to said axis, to shim the static magnetic field generated by the static magnetic field source.

14. A method for shimming a static magnetic field in a magnetic resonance imaging apparatus, said apparatus comprising a static magnetic field source having two opposite faces connected by a magnetic return structure, said opposite faces facing each other and being separated by a space configured to receive an examination subject therein, first and second assemblies respectively mounted at said opposite faces, said first and second assemblies each being comprised of a plurality of components with the components in said first assembly being disposed mirror-symmetrically, relative to a plane proceeding through said space, with respect to the components in the second assembly; said method comprising the steps of:
in each of said first and second assemblies, including in the mirror-symmetric components thereof a passive first shimming ring, and a passive second shimming ring disposed adjacent to said first shimming ring; and
adjustably mounting said second shimming ring relative to said first shimming ring and selectively adjusting a distance between said second shimming ring and said first shimming ring to shim said static magnetic field.

15. A method as claimed in claim 14 comprising the additional step, for shimming said static magnetic field of:
in each of said first and second assemblies, inserting a symmetrical arrangement of magnetic bolts, selected from the group consisting of magnetically conductive bolts and permanently magnetic bolts.

16. A method as claimed in claim 14 comprising the additional step, for shimming said static magnetic field of:
in each of said first and second assemblies, inserting a symmetrical arrangement of magnetic bolts, selected from the group consisting of magnetically conductive bolts and permanently magnetic bolts.

17. A method for shimming a static magnetic field in a magnetic resonance imaging apparatus, said apparatus comprising a static magnetic field source having two opposite faces connected by a magnetic return structure, said opposite faces facing each other and being separated by a space configured to receive an examination subject therein, said space having a center point, first and second assemblies respectively mounted at said opposite faces, said first and second assemblies each being comprised of a plurality of components with the components in said first assembly being disposed mirror-symmetrically, relative to a plane proceeding through said space, with respect to the components in the second assembly; said method comprising the steps of:
in said static magnetic field source, at each of said two opposite faces, providing a permanently magnetic arrangement to generate said static magnetic field; and
dividing each of said permanently magnetic arrangements into a plurality of permanently magnetic columns respectively having different magnetic energy levels, and disposing the plurality of permanently magnetic columns at each of said opposite faces symmetrically relative to an axis proceeding through said center point of said space and oriented perpendicularly to said plane, and making the magnetic energy levels equal for respective permanently magnetic columns in each plurality of permanently magnetic columns through which said axis proceeds.

18. A method as claimed in claim 17 comprising:
in each plurality of permanently magnetic columns, making the respective magnetic energy levels of columns farther from said axis higher than the respective magnetic energy levels of columns closer to said axis.

* * * * *